(12) United States Patent
Lee et al.

(10) Patent No.: US 6,836,399 B2
(45) Date of Patent: Dec. 28, 2004

(54) INTEGRATED CIRCUIT METAL-INSULATOR-METAL CAPACITORS FORMED OF PAIRS OF CAPACITORS CONNECTED IN ANTIPARALLEL

(75) Inventors: Soo-cheol Lee, Kyungki-do (KR); Dong-ryul Jang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/439,519

(22) Filed: May 16, 2003

(65) Prior Publication Data

US 2004/0012911 A1 Jan. 22, 2004

(30) Foreign Application Priority Data

Jul. 19, 2002 (KR) ........................................ 2002-42573

(51) Int. Cl.[7] ............................................. H01G 4/228
(52) U.S. Cl. ................................. 361/306.1; 361/306.2; 361/306.3; 361/321.1; 361/321.4; 361/328; 361/303; 438/250; 438/253; 438/393
(58) Field of Search ........................... 361/306.1, 321.1, 361/321.4, 306.3, 311, 313, 303, 328, 330, 305; 257/307, 306, 296, 297; 438/250, 253, 393

(56) References Cited

U.S. PATENT DOCUMENTS 5,777,839 A * 7/1998 Sameshima et al. ........ 361/311
6,222,221 B1 * 4/2001 Hou et al. .................. 257/307

* cited by examiner

Primary Examiner—Dean A. Reichard
Assistant Examiner—Nguyen T. Ha
(74) Attorney, Agent, or Firm—Myers Bigel Sibley & Sajovec (57) ABSTRACT

Metal-insulator-metal integrated circuit capacitors include a pair of metal-insulator-metal capacitors on an integrated circuit substrate that are electronically connected in antiparallel. The pair of metal-insulator-metal capacitors that are electrically connected in antiparallel has less capacitance variation as a function of voltage than either of the metal-insulator-metal capacitors.

25 Claims, 5 Drawing Sheets

INTEGRATED CIRCUIT METAL-INSULATOR-METAL CAPACITORS FORMED OF PAIRS OF CAPACITORS CONNECTED IN ANTIPARALLEL

RELATED APPLICATION

This application claims the benefit of Korean Patent Application No. 2002-0042573, filed Jul. 19, 2002, the disclosure of which is hereby incorporated herein by reference in its entirety as if set forth fully herein.

FIELD OF THE INVENTION

The present invention relates to integrated circuit capacitors, and more particularly to Metal-Insulator-Metal (MIM) integrated circuit capacitors.

BACKGROUND OF THE INVENTION

Since integrated circuit capacitors are used in a variety of integrated circuit devices, integrated circuit capacitors having relatively high speed and/or relatively large capacitance may be desired. As is well known to those having skill in the art, an integrated circuit capacitor includes first (lower) and second (upper) electrodes on an integrated circuit substrate, with a capacitor dielectric therebetween. In general, in order to realize capacitors having high speed, frequency dependence may be decreased by reducing the resistance of the capacitor electrodes. In addition, in order to realize capacitors of relatively large capacitance, the thickness of a dielectric layer between capacitor electrodes may be reduced, a high dielectric material may be used for the dielectric layer, and/or the area of the electrodes may be increased.

Capacitors used in integrated circuit devices may be classified into capacitors having a Metal-Oxide-Semiconductor (MOS) structure, capacitors having a pn junction structure, capacitors having a Polysilicon-Insulator-Polysilicon (PIP) structure, and capacitors having a Metal-Insulator-Metal (MIM) structure. Monocrystalline silicon or polycrystalline silicon may be used as at least one electrode material in capacitors of all of the above structures except the MIM structure. However, due to the physical properties of monocrystalline silicon or polycrystalline silicon, there may be limitations in reducing the resistance of the capacitor electrode. Hence, a MIM capacitor, which can provide metal capacitor electrodes having low resistance, may be used in applications that desire high-speed capacitor applications.

Figure 1A:
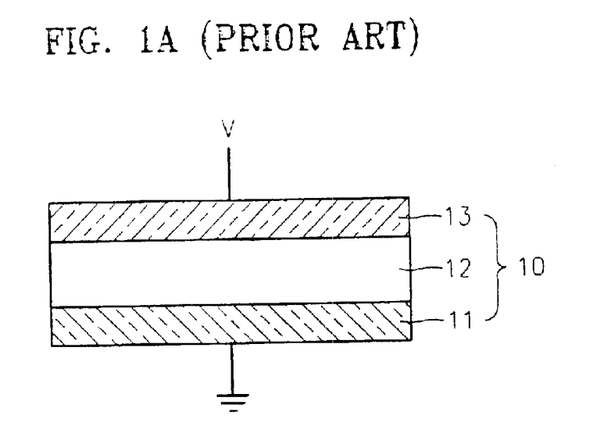
FIG. 1A shows a conventional metal-insulator-metal (MIM) capacitor.
Figure 1B:
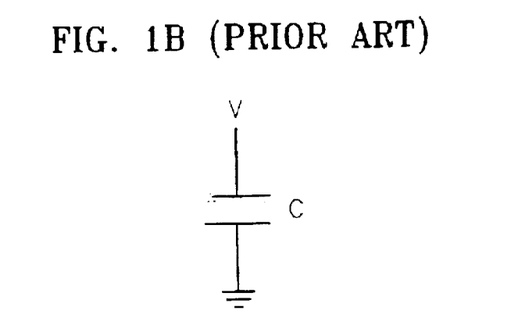
FIG. 1B shows an equivalent circuit diagram of the MIM capacitor of FIG. 1A.

FIG. 1A shows a conventional MIM capacitor. FIG. 1B shows an equivalent circuit diagram of the MIM capacitor of FIG. 1A.

Referring to FIG. 1A, a MIM capacitor 10 includes a lower metal layer 11, a dielectric layer 12, and an upper metal layer 13. The dielectric layer 12 is arranged between the lower metal layer 11 and the upper metal layer 13. In general, the upper metal layer 13 may be connected to a power terminal for supplying a voltage V having a predetermined level, and the lower metal layer 11 may be grounded (connected to a ground terminal). The MIM capacitor 10 has a predetermined capacitance C, as shown in FIG. 1B. Ideally, the capacitance C should be a constant value regardless of variation in the voltage V.

Figure 2:
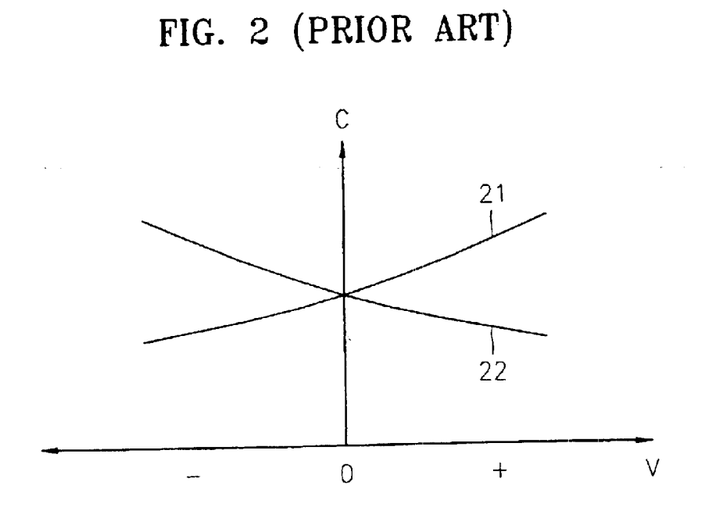
FIG. 2 shows a graph illustrating voltage-capacitance characteristics of the MIM capacitor of FIG. 1A.

FIG. 2 shows a graph illustrating voltage-capacitance characteristics of a MIM capacitor of FIG. 1A. As shown in FIG. 2, in practice, the capacitance C of the conventional MIM capacitor 10 may vary as the voltage V is varied. The variation may be classified into two cases: a case (21) where the capacitance C is increased as the voltage V is increased, and a case (22) where the capacitance C is decreased as the voltage V is increased.

Whether the capacitance C is increased or decreased as the voltage V is increased may depend on the material used to form the dielectric layer 12. For example, when the dielectric layer 12 of the MIM capacitor 10 is formed of silicon nitride ($Si_xN_y$), the capacitance C may decrease as the voltage V is increased. In any event, this real-world variation in capacitance as a function of voltage can negatively impact the performance of an integrated circuit device in which the MIM capacitor is used.

SUMMARY OF THE INVENTION

Metal-insulator-metal integrated circuit capacitors according to some embodiments of the present invention include a pair of metal-insulator-metal capacitors on an integrated circuit substrate that are electrically connected in antiparallel. In some embodiments, the pair of metal-insulator-metal capacitors comprise first and second portions of a first metal layer on an integrated circuit substrate, first and second portions of an insulating layer, a respective one of which is on a respective one of the first and second portions of the first metal layer, opposite the integrated circuit substrate, and first and second portions of a second metal layer, a respective one of which is on a respective one of the first and second portions of the insulating layer, opposite the first and second portions of the first metal layer. The first portion of the first metal layer is electrically connected to the second portion of the second metal layer, and the second portion of the first metal layer is electrically connected to the first portion of the second metal layer. In other embodiments, the pair of metal-insulator-metal capacitors has less capacitance variation as a function of voltage than either of the metal-insulator-metal capacitors.

According to other embodiments of the present invention, a metal-insulator-metal capacitor includes a first capacitor, in which a first lower metal layer, a first dielectric layer, and a first upper metal layer are stacked in sequence on an integrated circuit substrate. A second capacitor, in which a second lower metal layer, a second dielectric layer, and a second upper metal layer are stacked in sequence on the integrated circuit substrate, is also provided. The second lower metal layer is electrically connected to the first upper metal layer and the second upper metal layer is electrically connected to the first lower metal layer.

In some embodiments, the first upper metal layer of the first capacitor and the second lower metal layer of the second capacitor are connected to a power terminal, and the first lower metal layer of the first capacitor and the second upper metal layer of the second capacitor are connected to a ground terminal. In some embodiments, the first dielectric layer includes an $SiO_2$ layer, $Si_xN_y$ layer, $Si_xO_yF_z$ layer, $Si_xO_yN_z$ layer, and/or $Si_xO_yH_z$ layer. In other embodiments, the second dielectric layer includes an $SiO_2$ layer, $Si_xN_y$ layer, $Si_xO_yF_z$ layer, $Si_xO_yN_z$ layer and/or $Si_xO_yH_z$ layer.

Metal-insulator-metal integrated circuit capacitor structures according to other embodiments of the invention include a first dielectric layer on an integrated circuit substrate and first and second spaced apart portions of a first metal layer in the first dielectric layer. A second dielectric layer is provided on the first dielectric layer. First and second spaced apart portions of a capacitor dielectric layer are provided in the second dielectric layer, a respective one of which is on a respective one of the first and second spaced apart portions of the first metal layer. First and second spaced apart portions of a second dielectric layer also are provided, a respective one of which is on a respective one of the first and second spaced apart portions of the capacitor dielectric layer. In some embodiments, a first conductive contact electrically connects the first portion of the first metal layer to the second portion of the second metal layer, through the second dielectric layer. In other embodiments, a second conductive contact electrically contacts the second portion of the first metal layer to the first portion of the second metal layer, through the second dielectric layer. In still other embodiments, a third conductive contact electrically connects the second portion of the second metal layer to the integrated circuit substrate through the first and second dielectric layers. In still other embodiments, a fourth conductive contact electrically contacts the second portion of the first metal layer to the integrated circuit substrate.

According to other embodiments of the present invention, an integrated circuit device includes an integrated circuit substrate, a first interlayer dielectric (ILD) layer on the integrated circuit substrate and a first lower metal layer and a second lower metal layer on a first level on the surface of the first ILD layer, separated from each other by a second ILD layer. A first dielectric layer is on the first lower metal layer and a second dielectric layer is on the second lower metal layer. A third dielectric layer separates the first dielectric layer and the second dielectric layer from each other. A first upper metal layer and a second upper metal layer are also provided, a respective one of which is on a respective one of the first dielectric layer and the second dielectric layer, while being separated from each other on a second level on surfaces of the first dielectric layer and the second dielectric layer.

In some embodiments, the first dielectric layer includes an $SiO_2$ layer, $Si_xN_y$ layer, $Si_xO_yF_z$ layer, $Si_xO_yN_z$ layer, and/or $Si_xO_yH_z$ layer. In other embodiments, the second dielectric layer includes an $SiO_2$ layer, $Si_xN_y$ layer, $Si_xO_yF_z$ layer, $Si_xO_yN_z$ layer, and/or $Si_xO_yH_z$ layer.

In some embodiments, the integrated circuit device further includes a first conductive contact penetrating the first ILD layer, the second ILD layer, and the third ILD layer and connecting an active region of the integrated circuit substrate to the second upper metal layer. In other embodiments, the integrated circuit device further includes a second conductive contact penetrating the first ILD layer and connecting an active region of the integrated circuit substrate to the second lower metal layer. In yet other embodiments, the integrated circuit device further includes a third conductive contact penetrating the third ILD layer and connecting the second upper metal layer to the first lower metal layer. In still other embodiments, the integrated circuit device farther includes a fourth conductive contact penetrating the third ILD layer and connecting the first upper metal layer to the second lower metal layer.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

Figure 3A:
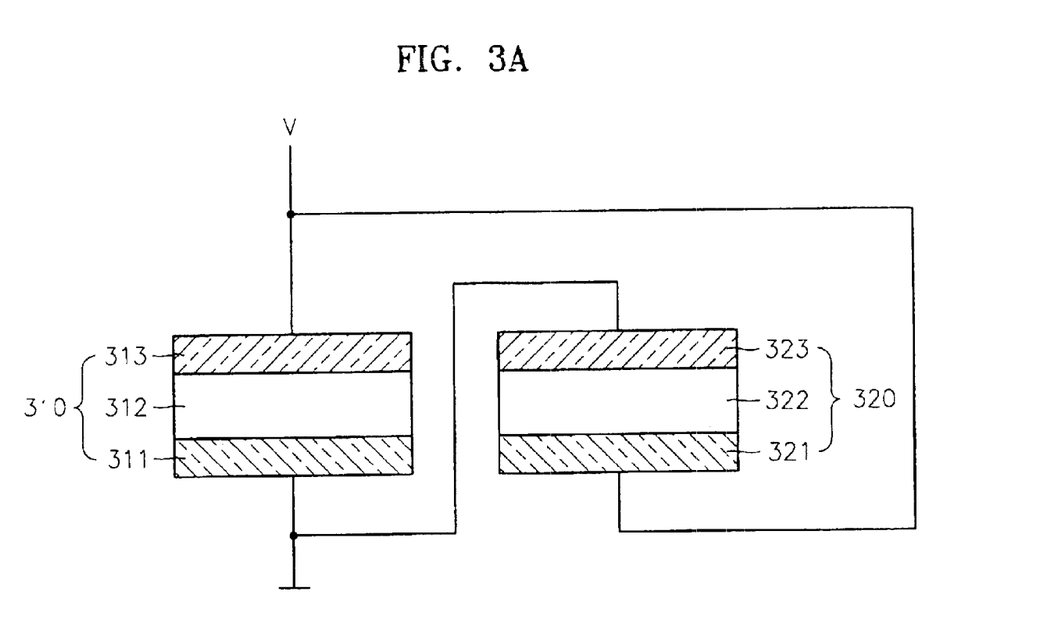
FIG. 3A shows a metal-insulator-metal (MIM) capacitor according to embodiments of the present invention.
Figure 3B:
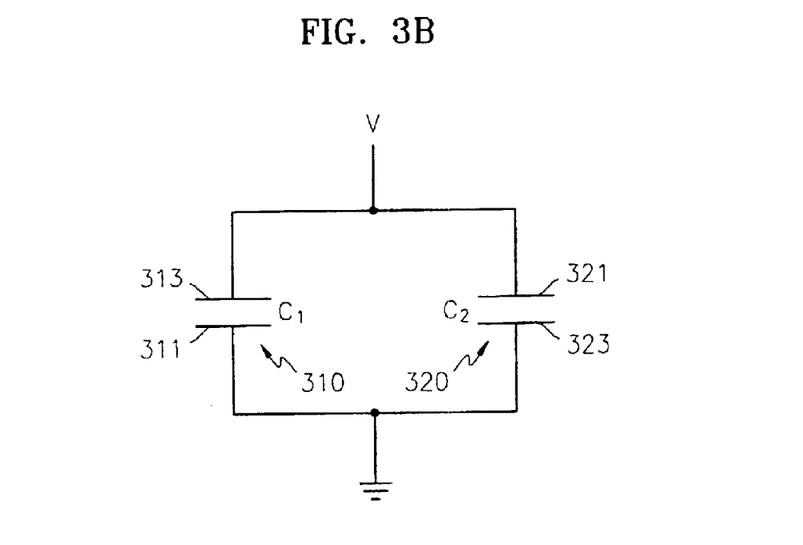
FIG. 3B shows an equivalent circuit diagram of an MIM capacitor of FIG. 3A according to embodiments of the present invention.

FIG. 3A shows a Metal-Insulator-Metal (MIM) capacitor according to embodiments of the present invention, and FIG. 3B shows an equivalent circuit diagram of an MIM capacitor of FIG. 3A.

Referring to FIGS. 3A and 3B, a metal-insulator-metal (MIM) capacitor according to embodiments of the present invention includes a first capacitor 310 and a second capacitor 320 that are electrically connected in antiparallel. The first capacitor 310 includes a first lower metal layer 311, a first dielectric layer 312, and a first upper metal layer 312. The first dielectric layer 312 is arranged between the first lower metal layer 311 and the first upper metal layer 313. The second capacitor 320 includes a second lower metal layer 321, a second dielectric layer 322, and a second upper metal layer 323. The second dielectric layer 322 is arranged between the second lower metal layer 321 and the second upper metal layer 323. The first and second lower metal layers are on an integrated circuit substrate such as a semiconductor substrate, as illustrated below.

In some embodiments, the first lower metal layer 311, the first upper metal layer 313, the second lower metal layer 321, and the second upper metal layer 323 comprise a metal layer having low resistance. The first dielectric layer 312 may include an $SiO_2$ layer, $Si_xN_y$ layer, $Si_xO_yF_z$ layer, $Si_xO_yN_z$ layer and/or $Si_xO_yH_z$ layer. Similarly, the second dielectric layer 322 may include an SiO₂ layer, Si$_x$N$_y$ layer, Si$_x$O$_y$F$_z$ layer, Si$_x$O$_y$N$_z$ layer and/or Si$_x$O$_y$H$_z$ layer.

The first capacitor 310 and the second capacitor 320 are electrically connected to each other in antiparallel. Thus, in some embodiments, the first lower metal layer 311 of the first capacitor 310 is electrically connected to the second upper metal layer 323 of the second capacitor 320. The first upper metal layer 313 of the first capacitor 310 is electrically connected to the second lower metal layer 321 of the second capacitor 320. In some embodiments, a voltage V is applied to the first upper metal layer 313 of the first capacitor 310 and the second lower metal layer 321 of the second capacitor 320 by connecting these layers to a voltage terminal. In some embodiments, the first lower metal layer 311 of the first capacitor 310 and the second upper metal layer 323 of the second capacitor 320 are grounded by connecting these layers to a ground terminal.

In this way, the total capacitance $C_T$ of the MIM capacitor in which the first capacitor 310 and the second capacitor 320 are connected to each other in antiparallel, is the sum of first capacitance $C_1$ of the first capacitor 310 and second capacitance $C_2$ of the second capacitor 320. The first capacitance $C_1$ of the first capacitor 310 varies as the voltage V is increased. Similarly, the second capacitance $C_2$ of the second capacitor 320 also varies as the voltage V is increased.

Figure 6:
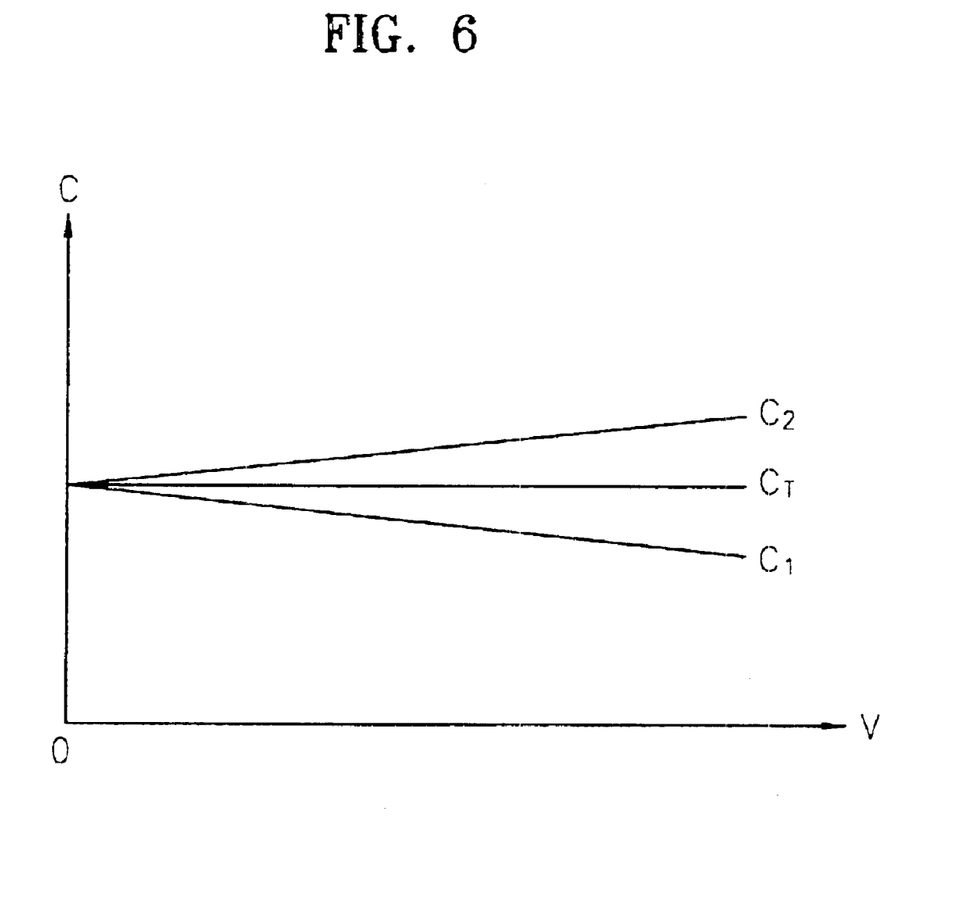
FIG. 6 shows a graph illustrating voltage-capacitance characteristics of an MIM capacitor of FIG. 3A according to embodiments of the present invention.

FIG. 6 shows a graph illustrating voltage-capacitance characteristics of an MIM capacitor of FIG. 3A. As shown in FIG. 6, the pair of MIM capacitors that are electrically connected in antiparallel has less capacitance variation as a function of voltage than either of the individual MIM capacitors.

Referring to FIG. 6, more specifically, as the voltage V is increased, the first capacitance $C_1$ of the first capacitor 310 and the second capacitance $C_2$ of the first capacitor 320 inversely vary. In some embodiments, as the voltage V is increased, the first capacitance $C_1$ of the first capacitor 310 gradually decreases, whereas the second capacitance $C_2$ of the second capacitor 320 gradually increases. This is because the directions of the voltage V, applied to the first capacitor 310 and the second capacitor 320, respectively, are opposite. That is, in the case of the first capacitor 310, the voltage V is applied to the first upper metal layer 313, but in the case of the second capacitor 320, the voltage V is applied to the second lower metal layer 321. Similarly, in the case of the first capacitor 310, the first lower metal layer 311 is grounded, but in the case of the second capacitor 320, the second upper metal layer 323 is grounded.

Thus, as the voltage V is varied, the first capacitance $C_1$ of the first capacitor 310 and the second capacitance $C_2$ of the second capacitor 320 inversely vary, and the variation function is also the same. As shown in FIG. 3B, and as described previously, the first capacitor 310 and the second capacitor 320 are connected to each other in antiparallel and, thus, the total capacitance $C_T$ is the sum of the first capacitance $C_1$ and the second capacitance $C_2$. Consequently, a decrease in the first capacitance $C_1$ and an increase in the second capacitance $C_2$ at least partially offset each other. Thus, even through the voltage V is increased, the total capacitance $C_T$ is maintained at a relatively constant level or only changes slowly as a function of voltage. More specifically, the pair of metal-insulator-metal capacitors that are electrically connected in antiparallel has less capacitance variation as a function of voltage than either of the individual MIM capacitors.

Referring again to FIG. 3A, it will be understood that the first lower metal layer 311 and the second lower metal layer 321 may comprise first and second spaced apart portions of a first metal layer, on an integrated circuit substrate. Moreover, the first dielectric layer 312 and the second dielectric layer 322 may comprise first and second portions of an insulating layer, a respective one of which is on a respective one of the first and second portions of the first metal layer, opposite the integrated circuit substrate. Finally, the first upper metal layer 313 and the second upper metal layer 323 may comprise first and second portions of a second metal layer, a respective portion of which is on a respective one of the first and second portions of the insulating layer, opposite the first and second portions of the first metal layer.

Figure 4:
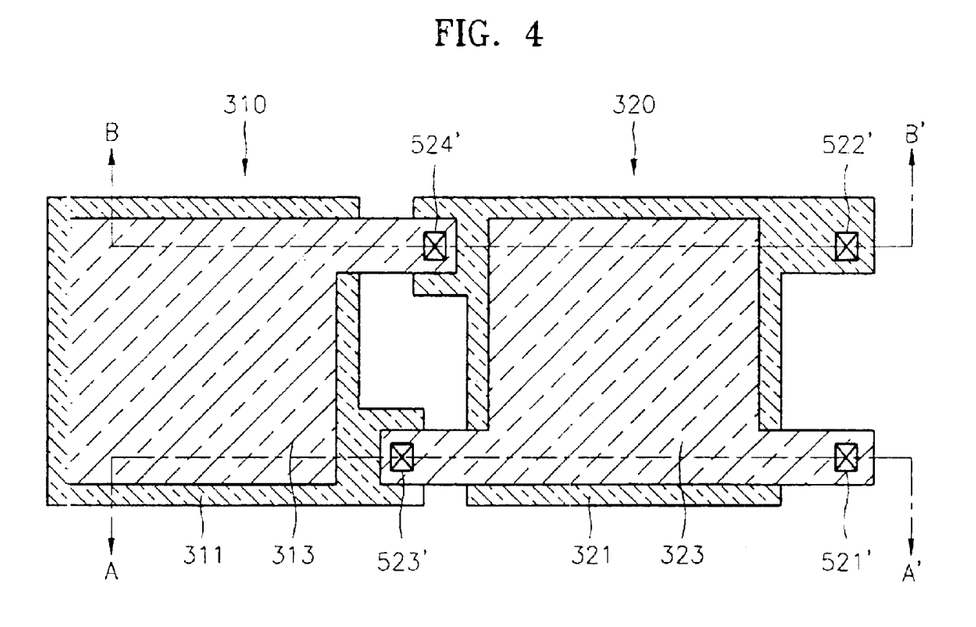
FIG. 4 shows a layout of wiring of the MIM capacitor of FIG. 3A according to embodiments of the present invention.
Figure 5A:
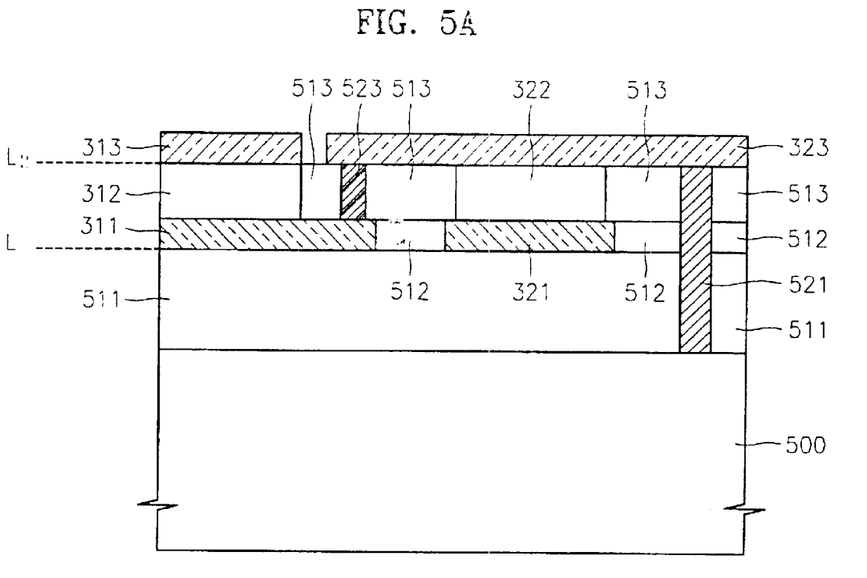
FIG. 5A shows a cross-sectional view of an integrated circuit device taken along line A–A' of FIG. 4 according to embodiments of the present invention.
Figure 5B:
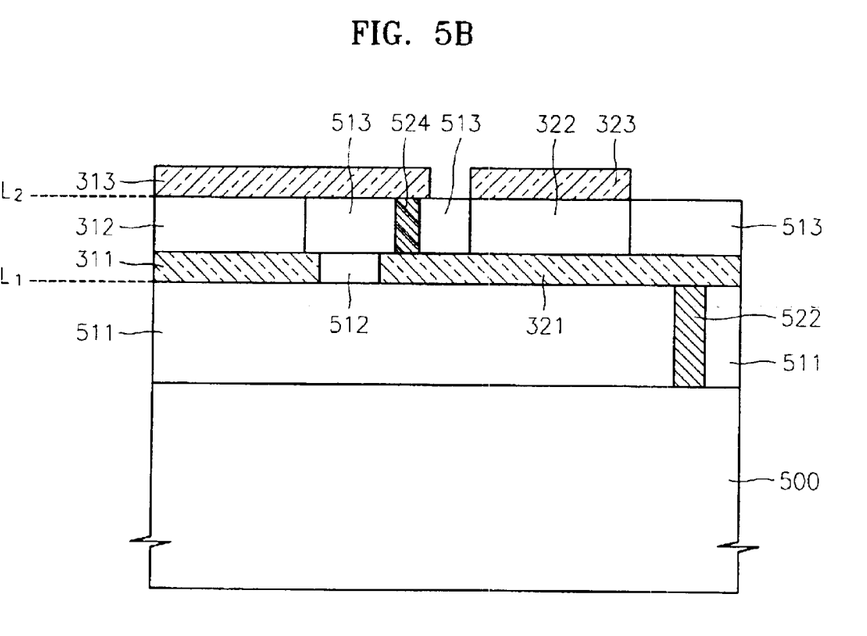
FIG. 5B shows a cross-sectional view of an integrated circuit device taken along line B–B' of FIG. 4 according to embodiments of the present invention.

FIG. 4 shows a layout of electrode wiring when an MIM capacitor according to some embodiments of the present invention is used in an integrated circuit. FIGS. 5A and 5B show cross-sectional views of the integrated circuit taken along lines A–A' and B–B' of FIG. 4, respectively, according to some embodiments of the present invention.

Referring to FIG. 4, the first lower metal layer 311 of the first capacitor 310 is first arranged, and the first upper metal layer 313 is arranged over the first lower metal layer 311. Although not shown in FIG. 4, a first dielectric layer is arranged between the first lower metal layer 311 and the first upper metal layer 313. Similar to the structure of the first capacitor 310, the second lower metal layer 321 of the second capacitor 320 is first arranged, and the second upper metal layer 323 is arranged over the second lower metal layer 321. Although not shown, a second dielectric layer is arranged between the second lower metal layer 321 and the second upper metal layer 323.

In the upper part of the layout of FIG. 4, the first upper metal layer 313 protrudes beyond the first lower metal layer 311, and similarly, the second lower metal layer 321 protrudes beyond the second upper metal layer 323. A protruding portion of the first upper metal layer 313 and a protruding portion of the second lower metal layer 321 overlap each other and contact each other by a contact region 524'. In the lower part of the layout of FIG. 4, the first lower metal layer 311 protrudes beyond the first upper metal layer 313, and similarly, the second upper metal layer 323 protrudes beyond the second lower metal layer 321. A protruding portion of the first lower metal layer 311 and a protruding portion of the second upper metal layer 323 overlap each other and contact each other by a contact region 523'.

The second lower metal layer 321 and the second upper metal layer 323 of the second capacitor 320 include portions protruding in different regions. A contact region 521' exists in the protruding portion of the second upper metal layer 323, and the second upper metal layer 323 contacts, for example, the substrate in the contact region 521'. Similarly, a contact region 522' also exists in the protruding portion of the second lower metal layer 321, and the second lower metal layer 321 contacts, for example, the substrate in the contact region 522'.

The above contact structure will be described in greater detail with reference to FIGS. 5A and 5B. A first interlayer dielectric (ILD) layer 511 is formed on an integrated circuit substrate, such as a semiconductor substrate 500. An impurity region may be included in the semiconductor substrate 500, and different layers or regions may be interposed between the semiconductor substrate 500 and the first ILD layer 511 as is well known to those having skill in the art. Spaced apart metal layer patterns are formed on a first level L1, which is placed on the surface of the first ILD layer 511. The spaced apart metal layer patterns form the first lower metal layer 311 and the second lower metal layer 321, respectively. A second ILD layer 512 is arranged between the first lower metal layer 311 and the second lower metal layer 321, and thus, the first lower metal layer 311 and the second lower metal layer 321 are electrically insulated from each other.

Spaced apart dielectric layer patterns are formed on the first lower metal layer 311, the second lower metal layer 321, and the second ILD layer 512. The spaced apart dielectric layer patterns form the first dielectric layer 312 and the second dielectric layer 322, respectively. A third ILD layer 513 is different from the first dielectric layer 312 and the second dielectric layer 322 in some embodiments, and is arranged between the first dielectric layer 312 and the second dielectric layer 322. Thus, the first dielectric layer 312 and the second dielectric layer 322 are electrically insulated from each other. The first dielectric layer 312 may include an $SiO_2$ layer, $Si_xN_y$ layer, $Si_xO_yF_z$ layer, $Si_xO_yN_z$ layer and/or $Si_xO_yH_z$ layer. Similarly, the second dielectric layer 322 may include an $SiO_2$ layer, $Si_xN_y$ layer, $Si_xO_yF_z$ layer, $Si_xO_yN_z$ layer and/or $Si_xO_yH_z$ layer.

Spaced apart metal layer patterns are also formed on a second level L2, which is placed on the surfaces of the first dielectric layer 312, the second dielectric layer 322, and the third ILD layer 513. The spaced apart metal layer patterns form the first upper metal layer 313 and the second upper metal layer 323, respectively. The first upper metal layer 313 and the second upper metal layer 323 are electrically insulated from each other.

The second upper metal layer 323 contacts the semiconductor substrate 500, for example, an active region thereof, by a first conductive contact 521, which penetrates through the first ILD layer 511, the second ILD layer 512, and the third ILD layer 513. The second lower metal layer 321 contacts the semiconductor substrate 500, for example an active region thereof, by a second conductive contact 522, which penetrates through the first ILD layer 511. The second upper metal layer 323 and the first lower metal layer 311 are connected to each other by a third conductive contact 523, which penetrates through the third ILD layer 513. In addition, the first upper metal layer 313 and the second lower metal layer 321 are connected to each other by a fourth conductive contact 524, which penetrates through the third ILD layer 513.

Accordingly, FIGS. 4, 5A and 5B also describe embodiments of the present invention wherein a first dielectric layer 512 is provided on an integrated circuit substrate and first and second spaced apart portions 311 and 321 of a first metal layer are provided in the first dielectric layer 512. A second dielectric layer 513 is provided on the first dielectric layer 512. First and second spaced apart portions 312 and 322 of a capacitor dielectric layer are provided in the second dielectric layer 513, a respective one of which is on a respective one of the first and second spaced apart portions 311 and 321 of the first metal layer. First and second spaced apart portions 313 and 323 of a second metal layer are also provided, a respective one of which is on a respective one of the first and second spaced apart portions 312, 322 of the capacitor dielectric layer. A first conductive contact 523 electrically connects the first portion 311 of the first metal layer to the second portion 323 of the second metal layer through the second dielectric layer 513. A second conductive contact 524 electrically connects the second portion 321 of the first metal layer to the first portion 313 of the second metal layer, through the second dielectric layer 513. A third conductive contact electrically connects the second portion 323 of the second metal layer to the integrated circuit substrate 500 through the first and second dielectric layers 512 and 513. A fourth conductive contact 522 electrically connects the second portion 321 of the first metal layer to the integrated circuit substrate 500.

As described above, in MIM capacitors according to embodiments of the present invention, the lower and upper electrodes of the first capacitor are connected to upper and lower electrodes of the second capacitor, respectively. Therefore, a variation in capacitance caused by a variation in voltages applied to both ends of a capacitor is at least partially compensated for by the first capacitor and the second capacitor, and more constant capacitance as a function of voltage can be obtained. In addition, even though the semiconductor device including the MIM capacitor is used in precise applications, there may be little or no variation in capacitance caused by a variation in voltage, which can improve the stability of the integrated circuit.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A metal-insulator-metal integrated circuit capacitor comprising:
   a first capacitor in which a first lower metal layer, a first dielectric layer, and a first upper metal layer are stacked in sequence on an integrated circuit substrate;
   a second capacitor in which a second lower metal layer, a second dielectric layer, and a second upper metal layer are stacked in sequence on the integrated circuit substrate, the second lower metal layer being electrically connected to the first upper metal layer and the second upper metal layer being electrically connected to the first lower metal layer; and
   a third dielectric layer between the first lower metal layer and the second lower metal layer.

2. The capacitor of claim 1, wherein the first upper metal layer of the first capacitor and the second lower metal layer of the second capacitor are connected to a power terminal, and the first lower metal layer of the first capacitor and the second upper metal layer of the second capacitor are connected to a ground terminal.

3. The capacitor of claim 1, wherein the first dielectric layer includes an $SiO_2$ layer, $Si_xN_y$ layer, $Si_xO_yF_z$ layer, $Si_xO_yN_z$ layer and/or $Si_xO_yH_z$ layer.

4. The capacitor of claim 1, wherein the second dielectric layer includes an $SiO_2$ layer, $Si_xN_y$ layer, $Si_xO_yF_z$ layer, $Si_xO_yN_z$ layer and/or $Si_xO_yH_z$ layer.

5. The metal-insulator-metal integrated capacitor of claim 1 further comprising a first conductive contact connecting an active region of the integrated circuit substrate to the second upper metal layer.

6. The metal-insulator-metal integrated capacitor of claim 1 further comprising a second conductive contact connecting an active region of the integrated circuit substrate to the second lower metal layer.

7. The metal-insulator-metal integrated capacitor of claim 1 further comprising a first conductive contact penetrating the third dielectric layer and connecting an active region of the integrated circuit substrate to one of the first or second upper metal layers.

8. A metal-insulator-metal integrated circuit capacitor comprising:
   a pair of metal-insulator-metal capacitors on an integrated circuit substrate that are electrically connected in antiparallel, wherein the pair of metal-insulator-metal capacitors comprise:

first and second portions of a first metal layer on the integrated circuit substrate;

first and second portions of an insulating layer, a respective one of which is on a respective one of the first and second portions of the first metal layer, opposite the integrated circuit substrate;

first and second portions of a second metal layer, a respective one of which is on a respective one of the first and second portions of the insulating layer, opposite the first and second portions of the first metal layer; and a third portion of the insulating layer between the first portion of the first metal layer and the second portion of the first metal layer;

wherein the first portion of the first metal layer is electrically connected to the second portion of the second metal layer and wherein the second portion of the first metal layer is electrically connected to the first portion of the second metal layer; and wherein the pair of metal-insulator-metal capacitors that are electrically connected in antiparallel has less capacitance variation as a function of voltage than either of the metal-insulator-metal capacitors.

9. An integrated circuit device comprising:

an integrated circuit substrate;

a first interlayer dielectric (ILD) layer on the integrated circuit substrate;

a first lower metal layer and a second lower metal layer on a first level on a surface of the first ILD layer, and separated from each other by a second ILD layer;

a first dielectric layer on the first lower metal layer;

a second dielectric layer on the second lower metal layer;

a third dielectric layer by which the first dielectric layer and the second dielectric layer are separated from each other; and a first upper metal layer and a second upper metal layer, a respective one of which is on a respective one of the first dielectric layer and the second dielectric layer, while being separated from each other on a second level on surfaces of the first dielectric layer and the second dielectric layer;

wherein the first lower metal layer, the first dielectric layer and the first upper metal layer form a first capacitor and the second lower metal layer, the second dielectric layer and the second upper metal layer form a second capacitor, and wherein the first and second capacitors are electrically connected in antiparallel.

10. The integrated circuit device of claim 9, wherein the first dielectric layer includes an $SiO_2$ layer, $Si_xN_y$ layer, $Si_xO_yF_z$ layer, $Si_xO_yN_z$ layer and/or $Si_xO_yH_z$ layer.

11. The integrated circuit device of claim 9, wherein the second dielectric layer includes an $SiO_2$ layer, $Si_xN_y$ layer, $Si_xO_yF_z$ layer, $Si_xO_yN_z$ layer and/or $Si_xO_yH_z$ layer.

12. The integrated circuit device of claim 9, wherein the first upper metal layer overlaps the second lower metal layer.

13. The integrated circuit device of claim 9, wherein the second upper metal layer overlaps the first lower metal layer.

14. An integrated circuit device comprising:

an integrated circuit substrate;

a first interlayer dielectric (ILD) layer on the integrated circuit substrate;

a first lower metal layer and a second lower metal layer on a first level on a surface of the first ILD layer, and separated from each other by a second ILD layer;

a first dielectric layer on the first lower metal layer;

a second dielectric layer on the second lower metal layer;

a third dielectric layer by which the first dielectric layer and the second dielectric layer are separated from each other;

a first upper metal layer and a second upper metal layer, a respective one of which is on a respective one of the first dielectric layer and the second dielectric layer, while being separated from each other on a second level on surfaces of the first dielectric layer and the second dielectric layer; and a first conductive contact penetrating the first ILD layer, the second ILD layer, and the third dielectric layer and connecting an active region of the integrated circuit substrate to the second upper metal layer.

15. An integrated circuit device comprising:

an integrated circuit substrate;

a first interlayer dielectric (ILD) layer on the integrated circuit substrate;

a first lower metal layer and a second lower metal layer on a first level on a surface of the first ILD layer, and separated from each other by a second ILD layer;

a first dielectric layer on the first lower metal layer, a second dielectric layer on the second lower metal layer;

a third dielectric layer by which the first dielectric layer and the second dielectric layer are separated from each other;

a first upper metal layer and a second upper metal layer, a respective one of which is on a respective one of the first dielectric layer and the second dielectric layer, while being separated from each other on a second level on surfaces of the first dielectric layer and the second dielectric layer; and a second conductive contact penetrating the first ILD layer and connecting an active region of the integrated circuit substrate to the second lower metal layer.

16. The integrated circuit device of claim 15, further comprising a third conductive contact penetrating the third ILD layer and connecting the second upper metal layer to the first lower metal layer.

17. The integrated circuit device of claim 15, further comprising a fourth conductive contact penetrating the third ILD layer and connecting the first upper metal layer to the second lower metal layer.

18. A metal-insulator-metal integrated circuit capacitor structure comprising:

a first dielectric layer on an integrated circuit substrate;

first and second spaced apart portions of a first metal layer in the first dielectric layer;

a second dielectric layer on the first dielectric layer;

first and second spaced apart portions of a capacitor dielectric layer in the second dielectric layer, a respective one of which is on a respective one of the first and second spaced apart portions of the first metal layer; and first and second spaced apart portions of a second metal layer, a respective one of which is on a respective one of the first and second spaced apart portions of the capacitor dielectric layer.

19. The capacitor of claim 18 further comprising:

a first conductive contact that electrically connects the first portion of the first metal layer to the second portion of the second metal layer, through the second dielectric layer.

20. The capacitor of claim 19 further comprising:

a second conductive contact that electrically connects the second portion of the first metal layer to the first portion of the second metal layer, through the second dielectric layer.

21. The capacitor of claim 20 further comprising:

a third conductive contact that electrically connects the second portion of the second metal layer to the integrated circuit substrate through the first and second dielectric layers.

22. The capacitor of claim 21 further comprising:

a fourth conductive contact that electrically connects the second portion of the first metal layer to the integrated circuit substrate.

23. The capacitor of claim 18 wherein the first spaced apart portion of the first metal layer, the first spaced apart portion of the capacitor dielectric layer and the first spaced apart portion of the second metal layer form a first capacitor and the second spaced apart portion of the first metal layer, the second spaced apart portion of the capacitor dielectric layer and the second spaced apart portion of the second metal layer form a second capacitor, and wherein the first and second capacitors are electrically connected in antiparallel.

24. A metal-insulator-metal integrated circuit capacitor comprising:

a first capacitor in which a first lower metal layer, a first dielectric layer, and a first upper metal layer are stacked in sequence on an integrated circuit substrate; and a second capacitor in which a second lower metal layer, a second dielectric layer, and a second upper metal layer are stacked in sequence on the integrated circuit substrate, the second lower metal layer being electrically connected to the first upper metal layer and the second upper metal layer being electrically connected to the first lower metal layer;

wherein the first upper metal layer overlaps the second lower metal layer.

25. The metal-insulator-metal capacitor of claim 24, wherein the second upper metal layer overlaps the first lower metal layer.

* * * * *